United States Patent
Bauer et al.

(10) Patent No.: US 7,662,664 B2
(45) Date of Patent: Feb. 16, 2010

(54) ELECTRONIC CIRCUIT IN A PACKAGE-ON-PACKAGE CONFIGURATION AND METHOD FOR PRODUCING THE SAME

(75) Inventors: Michael Bauer, Nittendorf (DE); Ludwig Heitzer, Regensburg (DE); Jens Pohl, Bernhardswald (DE); Peter Strobel, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 216 days.

(21) Appl. No.: 11/780,786

(22) Filed: Jul. 20, 2007

(65) Prior Publication Data
US 2008/0017967 A1    Jan. 24, 2008

(30) Foreign Application Priority Data
Jul. 20, 2006 (DE) .................. 10 2006 033 702

(51) Int. Cl.
*H01L 23/02* (2006.01)
*H01L 21/00* (2006.01)

(52) U.S. Cl. ................................ 438/106

(58) Field of Classification Search ............ 257/737, 257/738, E23.021, E23.069, 777, 778, E21.503, 257/E21.475, E21.499, 783, 787, 685, 686; 438/51, 55, 64, 106, 26, 25, 15
See application file for complete search history.

(56) References Cited

U.S. PATENT DOCUMENTS

| 6,025,648 | A | * | 2/2000 | Takahashi et al. ........... 257/778 |
| 2007/0040261 | A1 | * | 2/2007 | Hetzel et al. ................ 257/686 |

FOREIGN PATENT DOCUMENTS

| EP | 0611129 | * | 8/1994 |
| EP | 0611129 | A2 | 8/1994 |
| EP | 1308179 | A1 | 5/2003 |
| WO | 03032370 | A2 | 4/2003 |

* cited by examiner

*Primary Examiner*—Dao H Nguyen
*Assistant Examiner*—Tram H Nguyen
(74) *Attorney, Agent, or Firm*—Edell, Shapiro & Finnan, LLC

(57) ABSTRACT

An electronic circuit in a package-on-package configuration includes: a lower subassembly with a first electronic element, a first wiring carrier, a first housing with a first redistribution layer and an arrangement of solder balls disposed on the first redistribution layer and an upper subassembly with a second electronic element mounted on the lower subassembly. A method for producing the electronic circuit in a package-on-package configuration includes: adhering an upper side of the first electronic element to an underside of the first redistribution layer via a radiation-crosslinking thermoplastic adhesive.

13 Claims, 1 Drawing Sheet

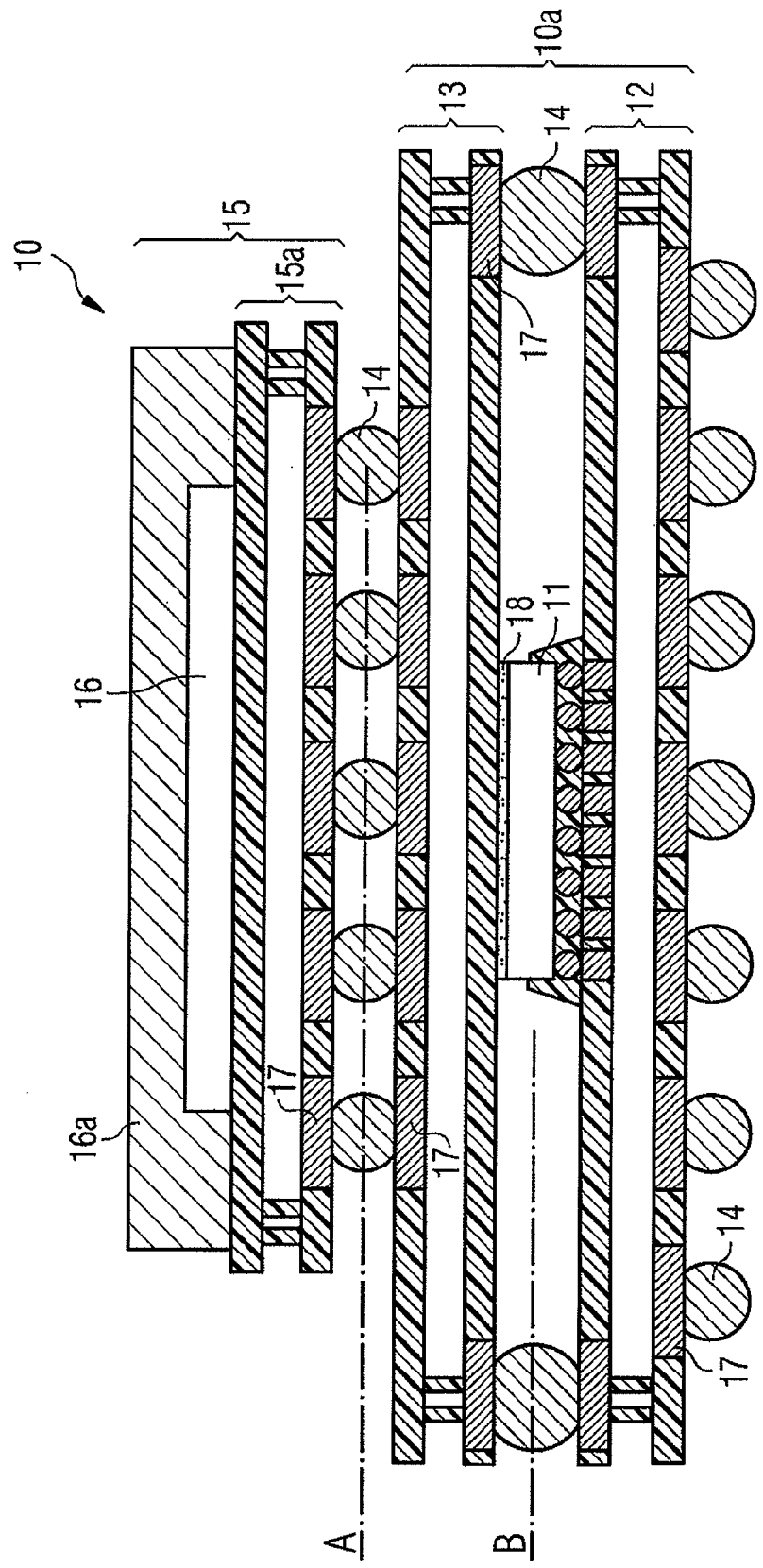

ELECTRONIC CIRCUIT IN A PACKAGE-ON-PACKAGE CONFIGURATION AND METHOD FOR PRODUCING THE SAME

CROSS REFERENCE TO RELATED APPLICATIONS

This application claims priority under 35 U.S.C. §119 to Application No. DE 102006033702.6 filed on Jul. 20, 2006, entitled "Production Method for an Electronic Circuit in a Package-On-Package Configuration and Electronic Component in Such a Configuration," the entire contents of which are hereby incorporated by reference.

BACKGROUND

Package-on-package (PoP) configurations comprising subassemblies that are electrically bonded with one another and mounted one on top of the other are known as packages. The lower subassembly is in this case referred to as the bottom package, while the subassembly mounted on the lower subassembly and bonded on it forms the top package.

The lower subassembly comprises a packaged first semiconductor element, in particular a semiconductor chip of the flip-chip type, on a wiring carrier. The wiring carrier is often formed as a ball grid array substrate (BGA substrate), together with a redistribution layer, known as an interposer.

Soldered onto this lower subassembly is the upper subassembly. This comprises a packaged second semiconductor element, likewise generally a semiconductor chip, on a further BGA substrate encapsulated in what is known as the molding compound.

BGA substrates of this type that are used for bonding and subassembly attachment have regular arrangements of solder balls on their underside. These solder balls are fused on in a soldering process in an oven heated to the required temperature, and thereby represent the electrical and mechanical connection to the bonding area respectively located underneath. In the case of the upper subassembly of the package-on-package configuration, this is in particular the connection between its substrate and the redistribution layer of the lower subassembly. The lower subassembly is in the same way bonded with a circuit board on which the entire package-on-package configuration is finally to be anchored.

For performing soldering processes of this type, first a pasty flux is stamped onto the area onto which the BGA substrate is to be mounted, or a solder paste made up of a flux and small solder balls embedded in it is used. The solder balls in this case even out irregularities in the respective underlying surface in an electrically conductive manner. The required soldering temperature is generally about 220-240° C. for lead-containing solders or about 260° C. for lead-free solders.

In the case of package-on-package housing configurations, the flux is first stamped onto the redistribution layer and then, in a further method step, the solder balls are stamped onto the flux. The solder balls are initially held by the adhesive force of the flux, until in the subsequent fusing process they fuse with the solder areas of the interposer or with those on the surface of the leadframe as the wiring carrier of the bottom package.

In the case of customary prior-art connecting techniques of this type, however, it is problematic to separate the lower subassembly from the upper one because, if an additional adhesive bond is not provided between the surface of the semiconductor element in the lower subassembly and the underside of the redistribution layer, it is not possible to determine precisely in advance whether in this separating operation the lower subassembly will actually be detached from the upper one or the lower subassembly will be torn apart at the connecting points between the redistribution layer and the leadframe. For this reason, it is not possible to do without an adhesive bond between the semiconductor element and the redistribution layer of the lower subassembly.

On the other hand, this adhesive bond is accompanied by additional production problems. So far, standard adhesives have been used for the adhesive attachment, adhesives which thermally cure and at the same time form a rigid mechanical connection when they are introduced into the soldering oven. This often has the result that there is only inadequate contact between the solder balls mentioned and the soldering areas assigned to them. The redistribution layer is virtually no longer movable in its position and it is no longer possible for height tolerances or irregularities to be evened out. This often leads to inadequate soldered connections between the redistribution layer and the leadframe.

SUMMARY

An electronic circuit in a package-on-package configuration includes: a lower subassembly with a first electronic element, a first wiring carrier, a first housing with a first redistribution layer and an arrangement of solder balls disposed on the first redistribution layer and an upper subassembly with a second electronic element mounted on the lower subassembly. A method for producing the electronic circuit in a package-on-package configuration includes: adhering an upper side of the first electronic element to an underside of the first redistribution layer via a radiation-crosslinking thermoplastic adhesive.

The method for producing electronic circuits in a package-on-package configuration makes it possible to produce a high yield of components with improved quality and reliability. Furthermore, a correspondingly improved component structure is described herein.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The FIGURE shows an electronic component in a Package-on-package (PoP) configuration.

DETAILED DESCRIPTION

An electronic circuit in a package-on-package (PoP) configuration and a method of producing the same are described herein. The described electronic circuit includes a special type of adhesive bond formed between an electronic element in the lower subassembly and a redistribution layer. This is intended to allow for a sufficiently long time a positional correction of the redistribution layer in all the subsequent production steps, in particular in a soldering process of the BGA substrates, and to permit a sufficiently strong connection between the electronic element and an interposer, such that a defined removal of an upper subassembly from the lower one can be carried out without the risk of the lower subassembly being torn apart and destroyed. As a result, much easier reworking of a PoP configuration, i.e., exchanging defective parts or adding to an existing configuration, is possible.

The method for producing the electronic circuit in a PoP configuration comprises the following method steps.

First, a radiation-crosslinking thermoplastic adhesive is applied to an upper side of a first semiconductor element or a side of a first housing of a lower subassembly that is facing the first semiconductor element. This is followed by mounting the first housing with a redistribution layer onto the first semiconductor element, with a contact area between the two being wetted with an adhesive.

This is followed by soldering the upper subassembly onto the redistribution layer when the adhesive is in a non-curing state. Finally, the arrangement formed in this way is irradiated with a radiation that is suitable for curing the adhesive. The irradiation has the effect that the adhesive is cured and a tension-resistant adhesive bond is formed between the first semiconductor element and the first housing.

A fundamental idea of the described production method is consequently that of completely separating the soldering process between the upper and lower subassemblies and the curing of the adhesive between the housing of the lower subassembly and the first semiconductor element completely from each other in the production process, i.e., carrying them out at different points in time, which in principle are freely selectable, and in different production steps.

The adhesive is of such a nature that the adhesive bond between the first semiconductor element and the redistribution layer remains in a soft pasty-viscous state at the temperatures of the soldering process. The curing of the adhesive and the solid adhesive bond brought about as a result is performed at another point in time, in principle any other point in time, via irradiation in a separate production step.

The application of the adhesive may be performed in various ways. When the adhesive has a predominantly viscous or pasty consistency, it is applied by printing or dispensing. When the adhesive is applied in a predominantly solid form, a film transfer is advantageous.

Both application by printing and dispensing and film transfer can allow for any special shaping of the adhesive area. For instance, application by printing is performed predominantly in the case of two-dimensional adhesive structures, while application by dispensing is advantageous in particular in the case of points or lines of adhesive. Film transfer is in turn suitable both for two-dimensional structures and for punctiform structures.

It is expedient to provide the adhesive between the first semiconductor element and the housing with a layer thickness that prevents the softened adhesive from flowing out from the contact area by capillary forces during the soldering attachment. This at the same time achieves homogeneous wetting of the connecting area and avoids contamination of the surroundings of the first electronic element with the adhesive.

The radiation-crosslinking thermoplastic adhesive is in particular a substantially two-component mixed adhesive with a thermoplastic component and a radiation-crosslinking component.

A thermoplastic material, for example acrylonitrile butadiene styrene copolymer (ABS), polymethyl methacrylate (PMMA), polycarbonate or various polyamides, in particular PA6, is optionally used as the thermoplastic component. Materials of this type have proven to be successful as thermoplastic materials in broad application areas.

Triallyl isocyanurate (TAIC) is relied on in particular as the radiation-crosslinking component, contained in the adhesive in an amount of 0.5 to 10 percent, preferably 1 to 5 percent. TAIC can be mixed with the thermoplastic materials mentioned and, when irradiated, cures these plastics by forming a polymer network structure.

The irradiation may be performed at any point in time during or after the soldering attachment. The point in time at which the adhesive layer hardens can consequently be planned entirely freely.

Radioactive particle radiation, preferably $\beta^+$ or $\beta^-$, is used for the irradiation. A great selection of relevantly known radioactive preparations is commercially available for this.

Irradiation in a shielded radiating chamber by exposure to high-energy electromagnetic radiation, in particular X-radiation or $\gamma$ radiation, is similarly possible. The externally acting radiation merely has to have sufficiently high penetrating power to bring about a crosslinking, and consequently curing, effect with adequately high intensity in the region of the adhesive layer. Moreover, the radiation type and dose, and possibly also the alignment of the radiation, should be chosen such that unintentional damage to the semiconductor structure of the finished semiconductor elements is ruled out.

An electronic component in a package-on-package configuration is described herein. The electronic component comprises a lower subassembly with a housed first electronic element on a first wiring carrier, in particular a BGA substrate, and a first redistribution layer with an upper subassembly soldered on the redistribution layer, is distinguished by an adhesive layer of a thermoplastic radiation-curing adhesive that bonds the underside of the redistribution layer to an upper side of the first electronic element.

The adhesive expediently takes the form of a mixed adhesive made up of a thermoplastic component, which softens at higher temperatures, in particular at soldering temperatures, and a component which crosslinks and cures the mixed adhesive when irradiated.

In the case of an expedient embodiment, the first semiconductor element is a semiconductor chip of the flip-chip type. Semiconductor chips of this type are used with preference in the case of package-on-package configurations.

The thermoplastic component of the mixed adhesive is formed by a polyamide material, in particular polyamide 6. The radiation-crosslinking component comprises triallyl isocyanurate (TAIC) comprising a proportion of 0.5 to 10 percent, optionally 1 to 5 percent.

The production method and the electronic element are to be described in more detail below on the basis of exemplary embodiments. The accompanying FIGURE serves for the purposes of illustration. This schematically shows an electronic component 10 in a package-on-package configuration with the adhesive bond described.

The FIGURE shows a lower subassembly in the form of a bottom package 10a with a first electronic element 11 (e.g., a flip chip). The flip chip is electrically bonded on a first wiring carrier 12. In the example shown here, the first wiring carrier is, for example, a ball grid array substrate (BGA substrate). The upper side of the bottom package 10 is formed by a redistribution layer 13, which is also referred to as an interposer. The BGA substrate and the interposer form the housing for the flip chip.

The electrical bonding of the bottom package 10a with a printed circuit board located under it (not represented in the FIGURE) is performed via solder balls 14 on the underside of the BGA substrate (i.e., the wiring carrier 12).

Electrically bonded and attached on the upper side of the bottom package is a top package 15. The top package comprises a second electronic element 16 (e.g., a further flip chip). This is attached and electrically bonded on a second wiring carrier 15a. In the case of the embodiment represented, the second wiring carrier is likewise formed as a BGA substrate with solder balls 14. These establish an electrically conductive connection between a series of contact pads 17 on the redistribution layer 13 of the bottom package 10a and the wiring carrier 15a of the top package 15. The solder balls 14 are also referred to as solder bumps, the contact pads 17 are also referred to as land pads.

The upper side of the first electronic element 11 in the bottom package 10 is connected to the underside of the redistribution layer 13 via an adhesive bond 18. This ensures that the removal of the top package 15 takes place along the separating line A between the wiring carrier 15a and the redistribution layer 13. The adhesive bond prevents in particular a possibly required removal of the top package from leading to tearing apart of the bottom package 10 between the redistribution layer 13 and the first wiring carrier 12 along the separating line B, and consequently destruction of the bottom package.

As previously explained at the beginning, the connecting of the components of the top package and of the bottom package is performed via a soldering process with fusing-on of the solder balls 14 in an oven process.

According to the described method, the adhesive bond 18 is established via a thermoplastic and radiation-crosslinking adhesive, for example, a mixed adhesive. The adhesive in this case flows under the temperature conditions of the soldering process, and only cures under externally acting irradiation.

In the case of producing the package-on-package configuration, shown by way of example in the FIGURE, the method for producing comprises the following method steps:

First, the first semiconductor element 11 is attached in an electrically conducting manner on the first wiring carrier 12. The upper side of the first semiconductor element or the underside of the redistribution layer 13 is then provided with a coating of the adhesive. The adhesive comprises an at least two-component mixture of a thermoplastic adhesive with admixture of the radiation-crosslinking component Triallyl Isocyanurate (TAIC) and optionally a readily volatile solvent and/or plasticizer. Depending on the specific formulation, at room temperature the adhesive has a solid, soft, pasty or viscous consistency.

In the case of a solid adhesive, application is expediently performed via a film transfer. In this case, a continuous strip is passed over the first semiconductor element or the redistribution layer, brought into contact with the surface in the appropriate region and the adhesive applied as a layer on the continuous strip is transferred. The transfer may be performed with sufficiently great pressing force via a stamp or a roller rolling behind the continuous strip. In this case, the stamp and/or roller may possibly heat up the contact region of the continuous strip with the surface of the semiconductor element, in order to ensure better and more homogeneous transfer of the adhesive.

Viscous or pasty adhesive formulations may also be deposited via a heated dispenser or print head. In this respect, the dispensing method is recommendable predominantly for depositing punctiform amounts of adhesive with circular or elliptical base areas, while in principle any desired printed areas can be produced with a print head.

After applying the adhesive, the adhesive may initially remain in the pasty or flowable consistency or assume a solid, but not cured, state at room temperature.

Subsequently, the redistribution layer (interposer) 13 is mounted. As can be seen from the FIGURE, the redistribution layer may also have, at least in certain portions, a BGA structure with the known solder balls 14. The mounting of the redistribution layer 13 is performed under the conditions of conventional solder ball bonding, i.e., the customary flux conditions bring about temporary adhesion and positional fixing of the redistribution layer on the wiring carrier 12. This is followed by a first soldering operation, in which the redistribution layer is solidly soldered to the wiring carrier 12. This produces the bottom package 10a.

It should be pointed out that, in the case of this production step, no curing of the adhesive layer takes place. Rather, the adhesive layer assumes a soft, compliant consistency and molds itself to any irregularities of the redistribution layer 13.

The mounting of the top package 15 on the redistribution layer 13 can then be performed. Solder ball bonding with the corresponding preparatory steps and the known operating parameters in the soldering oven is in turn relied on for this. Also under these conditions, the adhesive does not cure. Rather, there is further adaptation of the soft adhesive layer to the position of the redistribution layer, which may now easily have changed under the influence of the top package on it, while the adhesive layer does not cause any appreciable mechanical resistance during the soldering on of the top package.

At this point of the production method, the top package and the bottom package are solidly soldered to each other, while the adhesive layer is subsequently cured. For this purpose, irradiation of the adhesive layer is then performed to produce an internal microstructure that is crosslinked, and consequently cures the adhesive.

For curing, β radiation from commercially available radiation sources (e.g., a Ni-β source) is relied on. Instead of β radiation, the use of relevantly known γ sources, such as for example $^{60}$Co, is also possible. Alternatively, irradiation may also be performed with X-radiation. The use of β or γ radiation, with an appropriate choice of the radiation source, depends on the penetrating power of the radiation and the construction of the package-on-package configuration, but also on the available production technique, taking the radiation protection into consideration.

β radiation can be shielded relatively easily, but loses a considerable part of its energy when it penetrates the top or bottom package. γ radiation has a high penetrating power and may require stronger shielding. The proportion of the crosslinking component in the adhesive and the irradiating time must be planned accordingly. It is generally five to ten seconds, after which the adhesive layer is completely crosslinked, and consequently cured, and a subsequent rest time is not required.

It must be emphasized that the irradiation for curing the adhesive can in principle be performed at any desired point in time during the production process and is independent of the thermal exposure during the soldering process. The curing of the adhesive is expediently performed after completion of the last soldering process, i.e., after the soldering on of the top package, or in combination with it. The soldering oven required for this may be formed for this purpose as a combined heating and irradiating chamber. Timing by which sufficient mechanical rigidity of the configuration is in any case provided by the adhesive bond in the cooling phase after leaving the soldering oven is of advantage.

However, it is also possible to carry out the irradiation and curing of the adhesive at a much later point in time, for example, after the bonding of the package-on-package configuration on a higher-level carrier.

A series of modifications to the exemplary embodiments that are shown may be made within the scope of practice in the art, without departing from the basic idea of the invention.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of producing an electronic circuit in a package-on-package configuration, the configuration comprising: a lower subassembly with a first electronic element, a first wiring carrier, a first housing with a redistribution layer and an arrangement of solder balls disposed on the redistribution layer and an upper subassembly with a second electronic element, the upper subassembly being mounted on the lower subassembly, the method comprising:
    applying a radiation-crosslinking thermoplastic adhesive to one of an upper side of a first electronic element and a side of the first housing facing the first electronic element;
    mounting the first housing with the redistribution layer onto the first electronic element, with a contact area between the first electronic element and the first housing being wetted with the adhesive;
    soldering an upper subassembly with a second electronic element onto the redistribution layer when the adhesive is in a non-curing state, thereby forming an arrangement including: the upper subassembly with the second electronic element, the first housing with the redistribution layer, the adhesive and the first electronic element; and
    irradiating the arrangement such that a hardening of the adhesive results, thereby forming a solid adhesive bond between the first electronic element and the first housing.

2. The method according to claim 1, wherein the adhesive is applied in a pasty form via printing or dispensing.

3. The method according to claim 1, wherein the adhesive is applied in a solid form via a film transfer.

4. The method according to claim 1, wherein the adhesive is selected with a suitably adjusted formulation and applied with a layer thickness such that softened adhesive is prevented from flowing out of the contact area by capillary forces during the soldering of the upper subassembly.

5. The method according to claim 1, wherein the adhesive is a substantially two-component mixed adhesive with a thermoplastic component and a radiation-crosslinking component.

6. The method according to claim 5, wherein the thermoplastic component is a thermoplastic material selected from the group including: acrylonitrile butadiene styrene copolymer (ABS), polymethyl methacrylate (PMMA), polycarbonate and a polyamide.

7. The method according to claim 6, wherein the polyamide is polyamide 6 (PA6).

8. The method according to claim 5, wherein the radiation-crosslinking component comprises triallyl isocyanurate (TAIC).

9. The method according to claim 8, wherein the adhesive comprises an amount of TAIC in the range between 0.5 and 10 percent, inclusive.

10. The method according to claim 8, wherein the adhesive comprises an amount of TAIC in the range between 1 and 5 percent, inclusive.

11. The method according to claim 1, wherein the irradiation is performed subsequent to soldering the upper subassembly onto the redistribution layer.

12. The method according to claim 1, wherein the irradiation is performed via a radioactive particle radiation selected from the group including: $\beta^-$ and $\beta^+$ radiation.

13. The method according to claim 1, wherein the irradiation is performed in a shielded radiating chamber, with exposure to high-energy electromagnetic radiation selected from the group including: X-radiation and $\gamma$ radiation.

* * * * *